(12) United States Patent
Dhurjaty et al.

(10) Patent No.: US 11,612,047 B2
(45) Date of Patent: Mar. 21, 2023

(54) PLANAR TRANSFORMER FOR AN X-RAY SOURCE

(71) Applicant: Moxtek, Inc., Orem, UT (US)

(72) Inventors: Sreeram Dhurjaty, Rochester, NY (US); David Hoffman, Draper, UT (US); Bob West, Orem, UT (US)

(73) Assignee: Moxtek, Inc., Orem, UT (US)

( * ) Notice: Subject to any disclaimer, the term of this patent is extended or adjusted under 35 U.S.C. 154(b) by 222 days.

(21) Appl. No.: 17/201,221

(22) Filed: Mar. 15, 2021

(65) Prior Publication Data

US 2021/0319972 A1 Oct. 14, 2021

Related U.S. Application Data

(60) Provisional application No. 63/009,882, filed on Apr. 14, 2020.

(51) Int. Cl.
*H05G 1/12* (2006.01)
*H05G 1/20* (2006.01)
*H01J 35/02* (2006.01)

(52) U.S. Cl.
CPC ............... *H05G 1/12* (2013.01); *H05G 1/20* (2013.01); *H01J 35/025* (2013.01)

(58) Field of Classification Search
CPC .................................. H05G 1/12; H05G 1/20
See application file for complete search history.

(56) References Cited

U.S. PATENT DOCUMENTS

| 5,430,424 | A | * | 7/1995 | Sato | ..................... | H01F 27/2804 336/200 |
| 2001/0048361 | A1 | * | 12/2001 | Mays | ................. | G06K 7/10297 340/10.51 |

(Continued)

FOREIGN PATENT DOCUMENTS

JP 04-080031 U * 7/1992

OTHER PUBLICATIONS

S. C. Tang, S. Y. Hui and Henry Shu-Hung Chung, "Coreless planar printed-circuit-board (PCB) transformers—a fundamental concept for signal and energy transfer," in IEEE Transactions on Power Electronics, vol. 15, No. 5, pp. 931-941, Sep. 2000, doi: 10.1109/63.867683, 11 pgs.

(Continued)

*Primary Examiner* — Chih-Cheng Kao
(74) *Attorney, Agent, or Firm* — Thorpe North & Western, LLP

(57) ABSTRACT

It would be advantageous to reduce weight and size of high voltage power supplies, to increase frequency of pulses of high voltage, and to improve control of magnitude of high voltage. The embodiments of high voltage power supplies described herein can solve these problems. The high voltage power supply can be used with an x-ray tube. The high voltage power supply can comprise an array of planar transformers each defining a stage with an AC input and a DC output. Each stage can comprise a pair of flat, coil windings adjacent one another and including a primary winding electrically-coupled to the AC input and configured to induce a current in a secondary winding. At least two stages can be electrically-coupled together in series with the DC output of one stage electrically-coupled to an input of the other stage such that a voltage is amplified across the stages.

20 Claims, 6 Drawing Sheets

(56) References Cited

U.S. PATENT DOCUMENTS

| | | | | |
|---|---|---|---|---|
| 2002/0003408 | A1* | 1/2002 | Pascente | H05G 1/22 |
| | | | | 315/277 |
| 2002/0070835 | A1* | 6/2002 | Dadafshar | H01F 27/2804 |
| | | | | 336/200 |
| 2008/0130323 | A1* | 6/2008 | Wagner | H02M 3/285 |
| | | | | 363/21.02 |
| 2009/0322307 | A1* | 12/2009 | Ide | H02J 50/12 |
| | | | | 323/355 |
| 2013/0278371 | A1* | 10/2013 | Hongzhong | H01F 27/2871 |
| | | | | 336/232 |
| 2020/0060035 | A1* | 2/2020 | Hansen | H05K 5/064 |
| 2020/0413525 | A1* | 12/2020 | Zhu | H05G 1/58 |
| 2021/0075333 | A1* | 3/2021 | Rivas-Davila | H02M 3/01 |

OTHER PUBLICATIONS

G. J. Rohwein, "High-Voltage Air-Core Pulse Transformers," 37 pgs., 1981.

P. Czyz, T. Guillod, F. Krismer and J. W. Kolar, "Exploration of the Design and Performance Space of a High Frequency 166 kW/10 kV SiC Solid-State Air-Core Transformer," *2018 International Power Electronios Conference (IPEC-Niigata 2018—ECCE Asia)*, Niigata, Japan, 2018, pp. 396-403, doi: 10.23919/IPEC.2018.8507746, 8 pages.

\* cited by examiner

PLANAR TRANSFORMER FOR AN X-RAY SOURCE

CLAIM OF PRIORITY

This application claims priority to U.S. Provisional Patent Application No. 63/009,882, filed on Apr. 14, 2020, which is incorporated herein by reference.

FIELD OF THE INVENTION

The present application relates to x-ray sources and to high voltage power supplies.

BACKGROUND

High voltage power supplies have many uses, including portable x-ray sources. For example, the high voltage power supply can provide a large voltage (e.g. tens of kilovolts) between an electron emitter and a target material. This voltage differential, and sometimes high temperature of the electron emitter, can cause the electron emitter to emit electrons in an electron beam to the target. The target can include a material for generation of x-rays in response to impinging electrons from the electron emitter.

SUMMARY

High voltage power supplies can be heavy, making it difficult for a user to transport. It would be beneficial to reduce the weight of high voltage power supplies.

Some applications of high voltage power supplies, such as for example x-ray electrostatic dissipation, non-destructive testing of equipment, and x-ray fluorescence analysis, can require portable x-ray source insertion into small areas. It would be beneficial to reduce the size of high voltage power supplies.

Some applications require rapid pulses of high voltage. For example, rapid pulses of high voltage to an x-ray tube can result in rapid pulses of x-rays. A large bias voltage across the x-ray tube (i.e. between the cathode and the anode) can cause each pulse, A Cockcroft—Walton multiplier can generate the bias voltage of each pulse. Frequency of the pulses is limited due to electronics of the Cockcroft-Walton multiplier. For example, each pulse can have an undesirable duration due to a need to charge and discharge capacitors of the Cockcroft-Walton multiplier. It would be beneficial to increase the frequency of pulses of high voltage.

Some applications require control of the magnitude of the high voltage. For example, in an x-ray source, the x-ray spectrum emitted is dependent on input magnitude of voltage. Consequently, a feedback loop is used to adjust actual bias voltage to desired bias voltage; but the feedback loop increases x-ray source size and cost. It would be beneficial to improve control of the output x-ray energy, especially without a feedback loop.

Thus, it would be advantageous to reduce weight and size of high voltage power supplies, to increase frequency of pulses of high voltage, and to improve control of magnitude of high voltage. The invention includes high voltage power supplies, and x-ray sources with these high voltage power supplies, that satisfy these needs. Each high voltage power supply may satisfy one, some, or all of these needs.

The high voltage power supply can include multiple planar transformers, each defining a stage, electrically-coupled together in series. Each stage can include a primary circuit and a secondary circuit. The primary circuit can include an alternating current source electrically-coupled to a primary winding. The secondary circuit can include a secondary winding and a rectifier circuit in series.

The secondary circuit of each stage, except for a lowest voltage stage, can be electrically coupled to a DC output of the rectifier circuit of a lower voltage stage. The DC output of the rectifier circuit of each stage, except for a highest voltage stage, can be electrically coupled to the secondary circuit of a higher voltage stage. The DC output of the rectifier circuit of the highest voltage stage can be electrically coupled to the x-ray tube.

BRIEF DESCRIPTION OF THE DRAWINGS (DRAWINGS MIGHT NOT BE DRAWN TO SCALE)

Figure 9A:
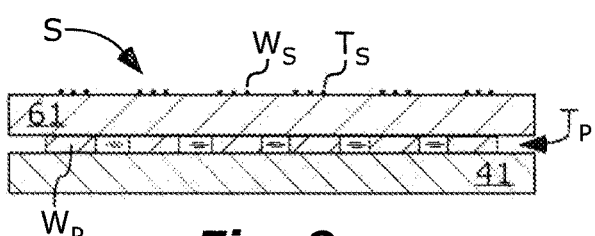

FIG. 9a is a cross-sectional side-view of a portion of a stage S with the primary trace and the secondary trace in close proximity, the primary trace and the secondary trace on separate circuit boards 41 and 61, and the primary trace sandwiched between circuit boards 41 and 61.

Figure 9B:
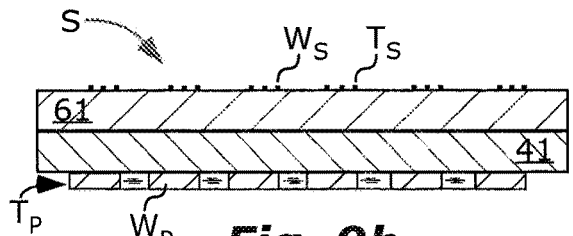

FIG. 9b is a cross-sectional side-view of a portion of a stage S with the primary trace and the secondary trace in close proximity, the primary trace and the secondary trace on separate circuit boards 41 and 61, and both circuit boards 41 and 61 sandwiched between the primary trace and the secondary trace.

Figure 10:
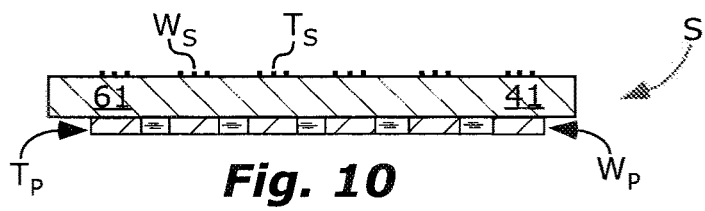

FIG. 10 is a cross-sectional side-view of a portion of a stage S, similar to the stage S of FIG. 9b, except that the primary circuit board 41 and the secondary circuit board 61 are the same circuit board 41/61.

Figure 11A:
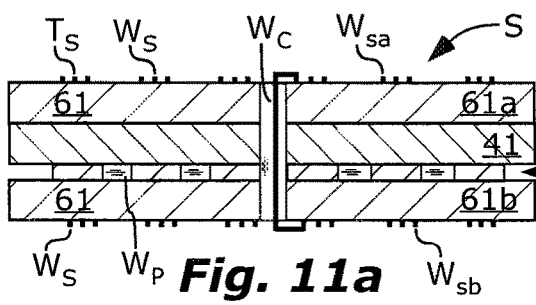

FIG. 11a is a cross-sectional side-view of a portion of a stage S, similar to the stages S of FIGS. 9a and 9b, except that the secondary circuit board 61 includes two secondary circuit boards 61a and 61b, and the secondary winding $W_S$ includes two secondary winding parts $W_{sa}$ and $W_{sb}$.

Figure 11B:
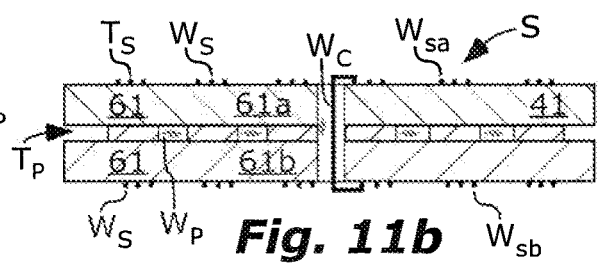

FIG. 11b is a schematic, cross-sectional side-view of a portion of a stage S, similar to the stages S of FIG. 11a, except that the primary circuit board 41 is the same as one of the two secondary circuit boards 61a or 61b.

Figure 12:
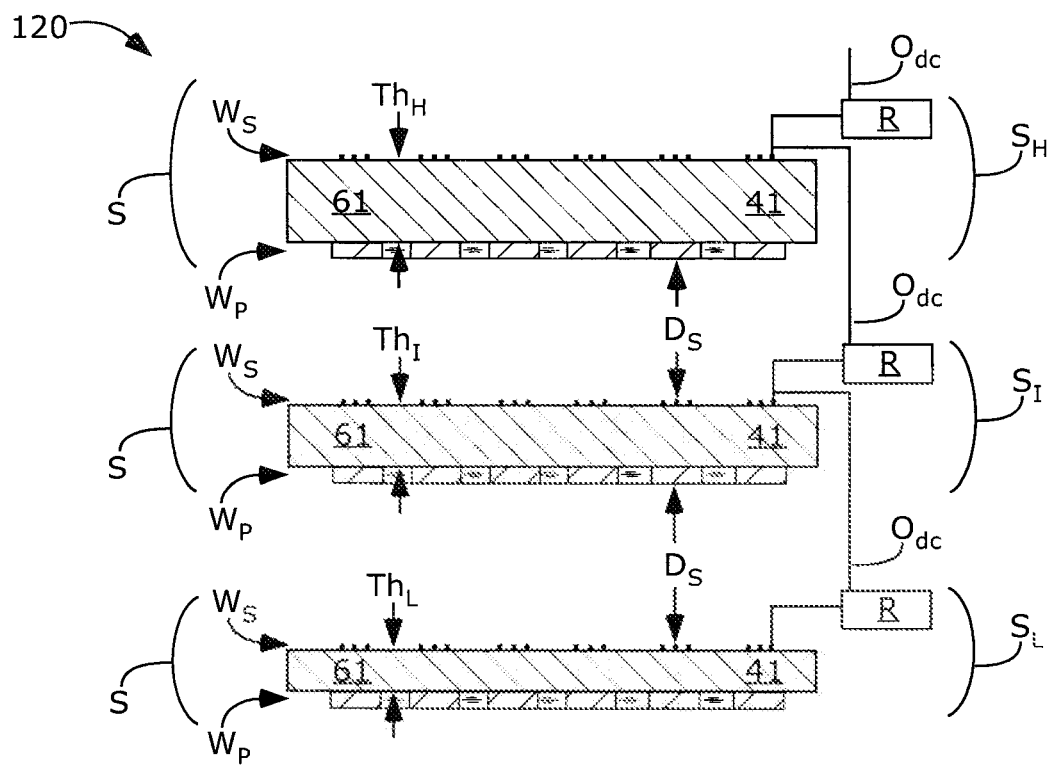

FIG. 12 is a schematic of a high voltage power supply 120 illustrating a relationship of thicknesses $Th_L$, $Th_P$, and $Th_H$ of the circuit boards 41 and 61.

Figure 13:
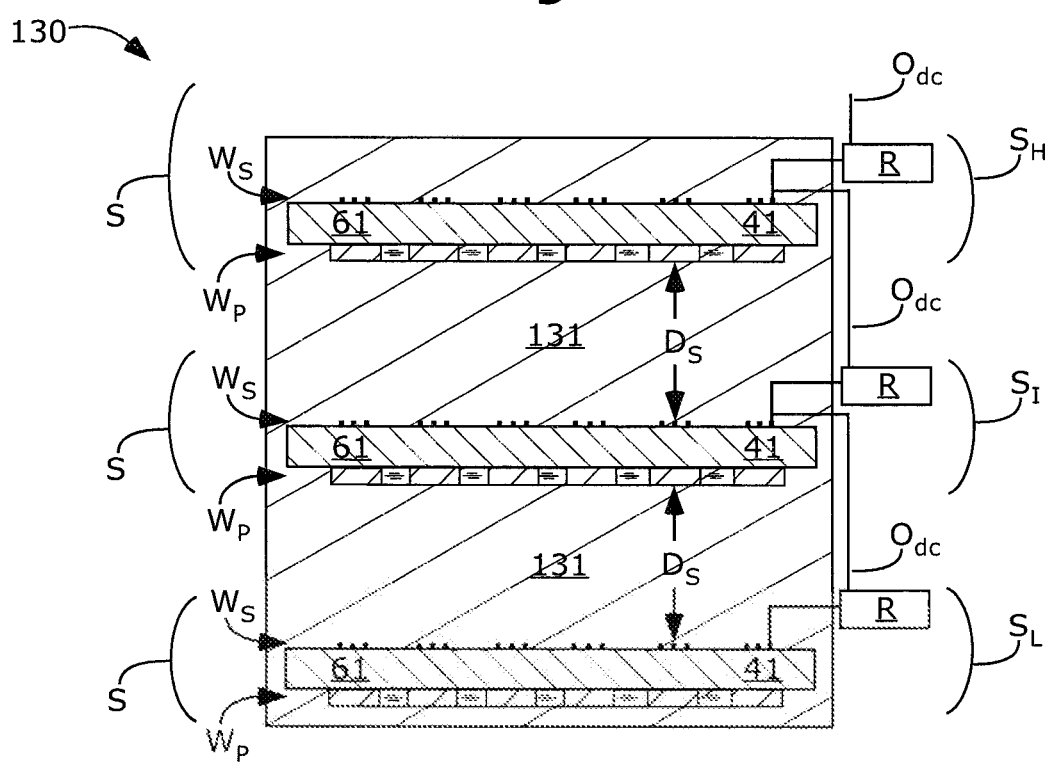

FIG. 13 is a schematic of a high voltage power supply 120 with potting 131 between adjacent stages S.

Figure 14:
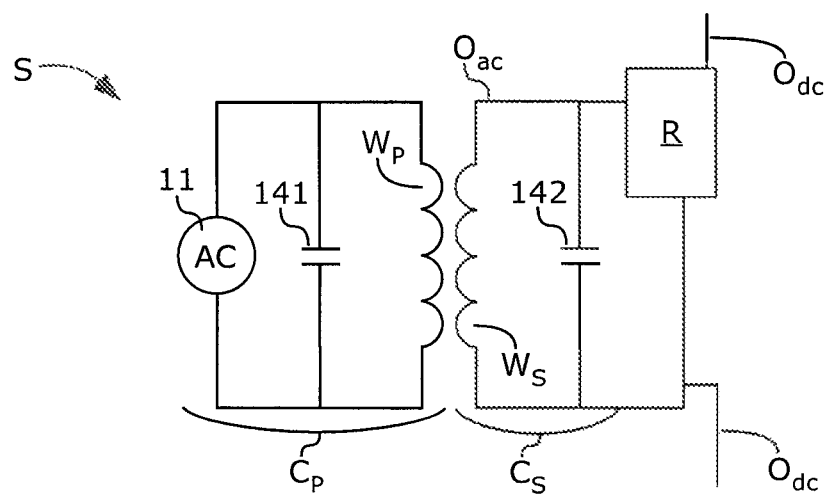

FIG. 14 is a schematic of a stage S of a high voltage power supply with a primary capacitor 141 electrically-coupled in parallel with the primary winding $W_P$ and a secondary capacitor 142 electrically-coupled in parallel with the secondary winding $W_S$.

DEFINITIONS

As used herein, the term "AC" means alternating current and the term "DC" means direct current.

As used herein, the term "adjoin" means direct and immediate contact. As used herein, the term "adjacent" includes adjoin, but also includes near or next to with other material(s) between the adjacent items.

As used herein, the term "parallel" means: exactly parallel; parallel within normal manufacturing tolerances: or almost exactly parallel, such that any deviation from exactly parallel would have negligible effect for ordinary use of the device.

As used herein, the term "x-ray tube" is not limited to tubular/cylindrical shaped devices. The term "tube" is used because this is the standard term used for x-ray emitting devices.

As used herein, the term "kV" means kilovolt(s), the term "mm" means millimeter(s), the term nH means nanohenry(s), the term pH means microhenry(s), the term "µF" means microfarad(s), and the term "pF" means picofarad(s).

DETAILED DESCRIPTION

Figure 1:
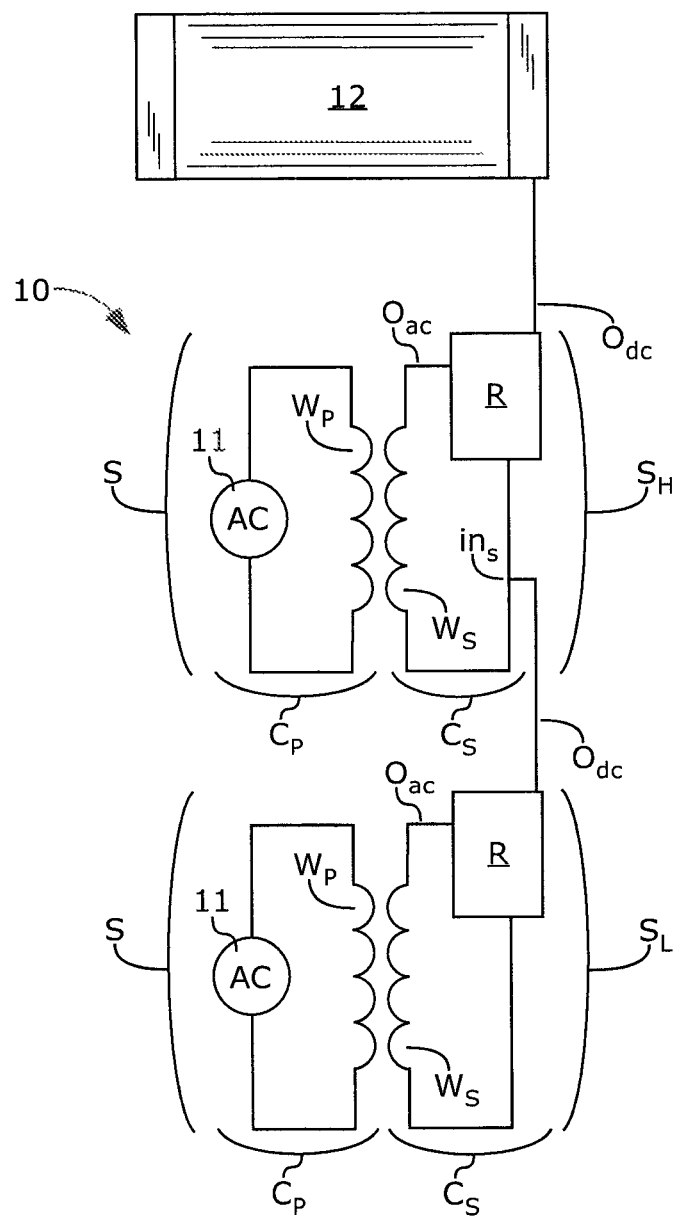
FIG. 1 is a schematic of a high voltage power supply 10 with multiple planar transformers, each defining a stage S, electrically-coupled together in series, including a lowest voltage stage $S_L$ and a highest voltage stage $S_H$, and a DC output $O_{dc}$ of the highest voltage stage $S_H$ electrically coupled to a high voltage device 12.
Figure 2:
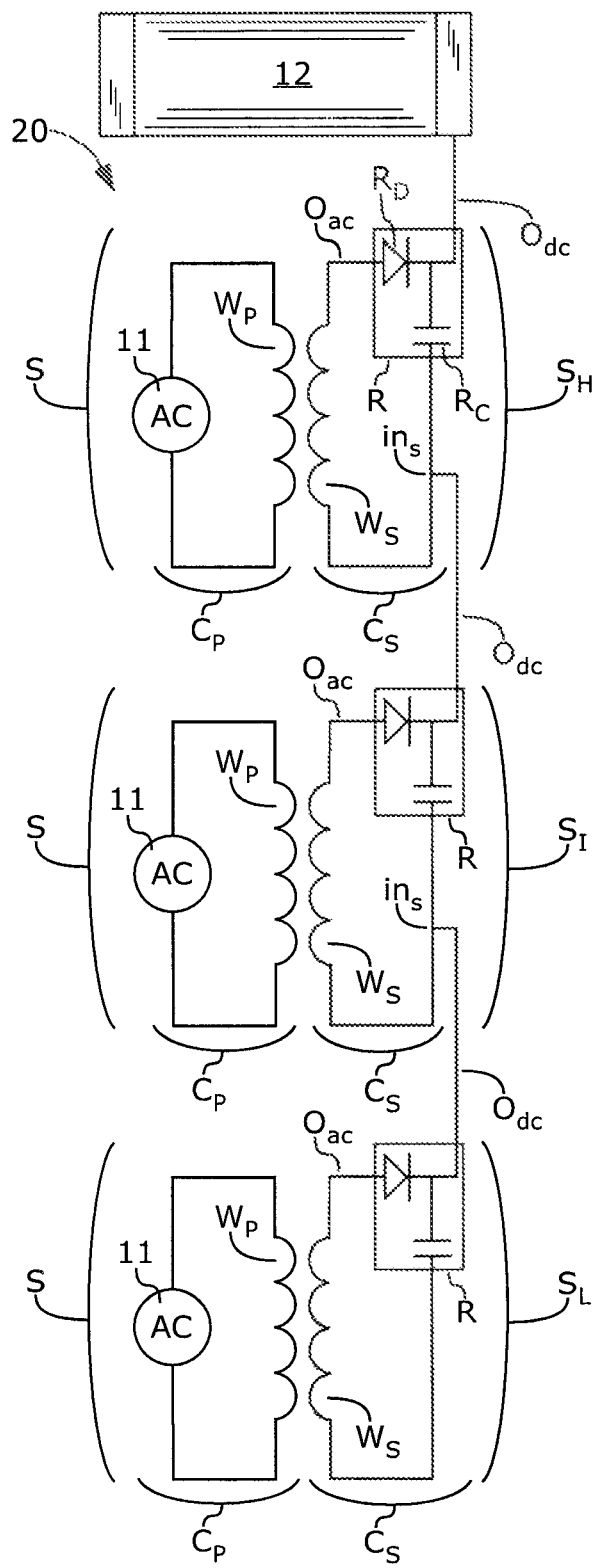
FIG. 2 is a schematic of a high voltage power supply 20, similar to high voltage power supply 10, but further comprising an intermediate stage $S_I$ between the lowest voltage stage $S_L$ and the highest voltage stage $S_H$.
Figure 3:
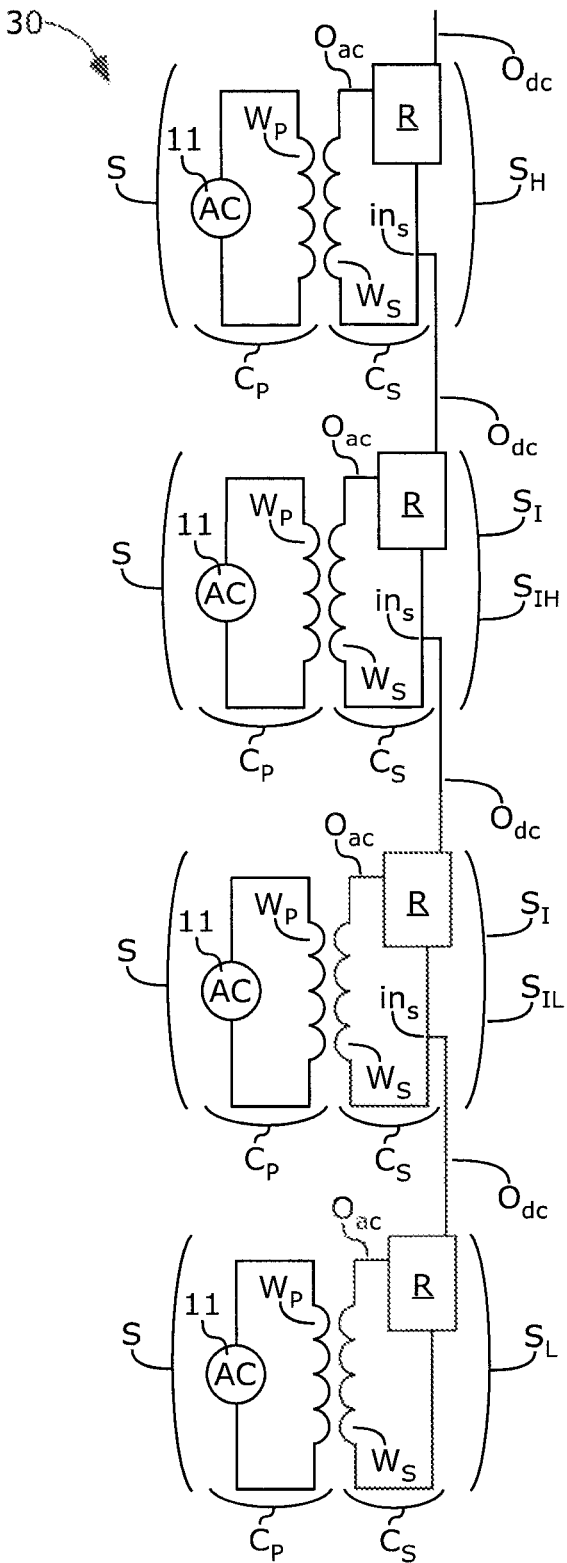
FIG. 3 is a schematic of a high voltage power supply 30, similar to high voltage power supply 10, but further comprising two intermediate stages $S_I$ between the lowest voltage stage $S_L$ and the highest voltage stage $S_H$.

As illustrated in FIGS. 1-3, high voltage power supplies 10, 20, and 30 include multiple planar transformers (i.e. an array of planar transformers). Each planar transformer defines a stage S. The stages S can be electrically coupled in series.

Each stage S can include a primary circuit $C_P$ and a secondary circuit Cs. The primary circuit $C_P$ can include an alternating current source 11 electrically coupled to a primary winding $W_P$. The alternating current source 11 can provide alternating electrical current through the primary winding $W_P$.

The primary winding $W_P$ and the secondary winding $W_S$ can each be flat, coil windings. The primary winding $W_P$ and the secondary winding $W_S$ can be adjacent to each other. The primary winding $W_P$ and the secondary winding $W_S$ can be spaced apart from each other. There can be solid material between the primary winding $W_P$ and the secondary winding $W_S$. The primary winding $W_P$ can be located in close proximity to the secondary winding $W_S$ such that alternating electrical current through the primary winding $W_P$ will induce an alternating electrical current through the secondary winding $W_S$, resulting in an AC output $O_{ac}$ in the secondary winding $W_S$.

A rectifier circuit R can be electrically coupled to the AC output $O_{ac}$ and can rectify the alternating current from the secondary winding $W_S$ to provide a DC output $O_{dc}$. The DC output $O_{dc}$ of each stage, except for the DC output $O_{dc}$ of a highest voltage stage $S_H$, can be electrically coupled to an input in$_s$ of the secondary circuit Cs of a higher voltage stage S. The input in$_s$ can be outside of the rectifier circuit R of the higher voltage stage S, such as between the secondary winding $W_S$ and the rectifier circuit R.

All stages S, except for a lowest voltage stage $S_L$, can be electrically coupled to the DC output $O_{dc}$ of a lower voltage stage S.

Thus, a voltage can be amplified across the stages S. The voltage rise of the stages S can be added together.

The DC output $O_{dc}$ of the rectifier circuit R of the highest voltage stage $S_H$ can be electrically coupled to a high voltage device 12. An x-ray tube is one example of a high voltage device 12. The DC output $O_{dc}$ can be electrically coupled to an electron emitter (e.g. filament) or an anode of the x-ray tube.

As illustrated in FIG. 1, the high voltage power supply 10 can have a lowest voltage stage $S_L$ and a highest voltage stage $S_H$. The DC output $O_{dc}$ of the lowest voltage stage $S_L$ can be electrically coupled to the secondary circuit Cs of the highest voltage stage $S_H$.

As illustrated in FIG. 2, the high voltage power supply 10 can have a lowest voltage stage $S_L$, an intermediate stage $S_I$, and a highest voltage stage $S_H$. The DC output $O_{dc}$ of the lowest voltage stage $S_L$ can be electrically coupled to the secondary circuit Cs of the intermediate stage $S_I$. The DC output $O_{dc}$ of the intermediate stage $S_I$ can be electrically coupled to the secondary circuit Cs of the highest voltage stage $S_H$.

As illustrated in FIG. 3, the high voltage power supply 30 can comprise at least four stages, including a lowest voltage stage $S_L$, a highest voltage stage $S_H$, and two intermediate stages $S_I$ between the lowest voltage stage $S_L$ and the highest voltage stage $S_H$. There can be more than two intermediate stages $S_1$. The number of intermediate stages $S_I$ can be selected based on desired DC voltage increase/decrease, size, cost, voltage standoff, and manufacturability.

The DC output $O_{dc}$ of the lowest voltage stage $S_L$ can be electrically coupled to the secondary circuit Cs of a lower voltage intermediate stage $S_{IL}$. The DC output $O_{dc}$ of the lower voltage intermediate stage $S_{IL}$ can be electrically coupled to the secondary circuit Cs of a higher voltage intermediate stage $S_{IH}$. The DC output $O_{dc}$ of the higher voltage intermediate stage $S_{IH}$ can be electrically coupled to the secondary circuit Cs of the highest voltage stage $S_H$.

In high voltage power supplies 10, 20, and 30, the DC output $O_{dc}$ of the highest voltage stage $S_H$ can be electrically coupled to a high voltage device 12. The high voltage device 12 can be an x-ray tube and the DC output $O_{dc}$ of the highest voltage stage $S_H$ can be electrically coupled to a cathode (or an anode) of the x-ray tube. The anode (or cathode) of the x-ray tube can be electrically coupled to ground. The primary winding $W_P$ can be electrically coupled to ground. Thus, the anode (or cathode) of the x-ray tube and the primary winding $W_P$ can be the same or similar electrical potential.

The rectifier circuit R can include a capacitor $R_C$ and a diode $R_D$ in series (see FIG. 2). The DC output $O_{dc}$ of the rectifier circuit R, of the lower voltage stage, can be connected between the capacitor $R_C$ and the diode $R_D$ of the rectifier circuit R. The rectifier circuit R of FIG. 2, with a capacitor $R_C$ and a diode $R_D$ in series, can be used in any rectifier circuit R described herein, including those shown in any of FIGS. 1, 3, and 12-14. The rectifier circuit R of FIG. 2 can be combined with the stages S of FIGS. 4-11b.

These high voltage power supplies 10, 20, and 30, with multiple planar transformers, can be combined with any other high voltage power supply or stage S examples described herein, including those shown in any of FIGS. 4-14.

Figure 4:
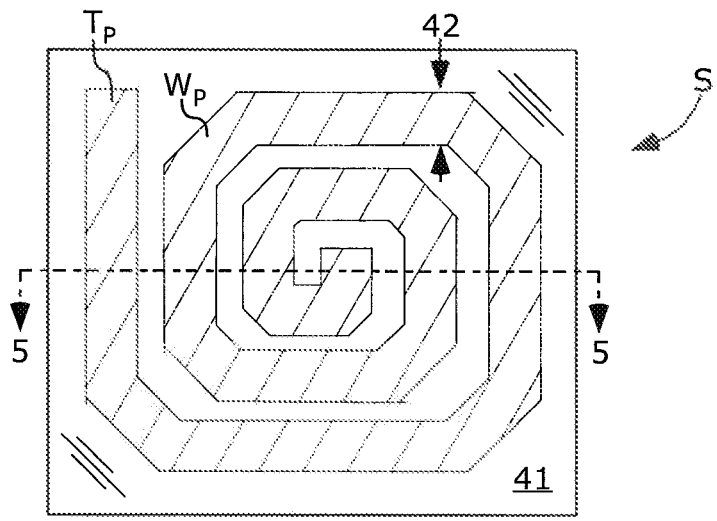
FIG. 4 is a top-view of a portion of a stage S with a primary winding $W_P$ in the form of a primary trace on a primary circuit board 41, the primary trace including a spiral shape.
Figure 5:
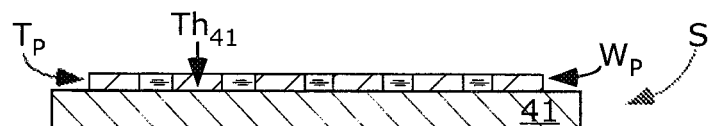
FIG. 5 is a cross-sectional side-view of the stage S of FIG. 4 taken along line 5-5.
Figure 6:
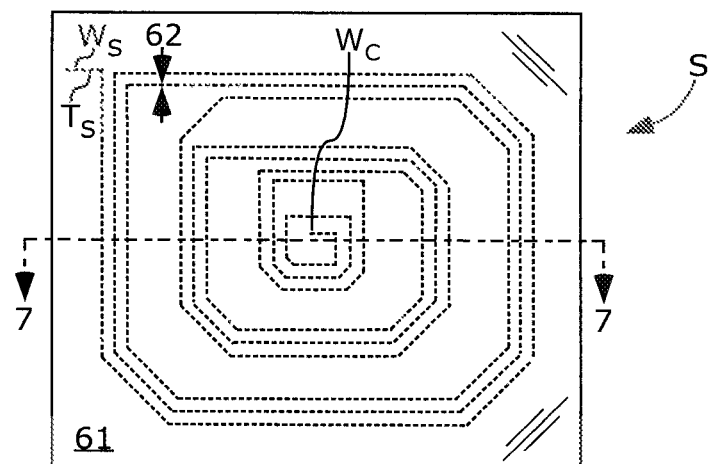
FIG. 6 is a top-view of a portion of a stage S with a secondary winding $W_P$ in the form of a secondary trace on a secondary circuit board 61, the secondary trace including a spiral shape.
Figure 7:
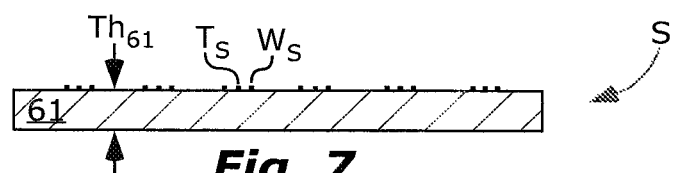
FIG. 7 is a cross-sectional side-view of the stage S of FIG. 6 taken along line 7-7.

As illustrated in FIGS. 4-5, the primary winding $W_P$ can be a primary trace $T_P$ on a primary circuit board 41. The primary trace $T_P$ can include a spiral shape. As illustrated in FIGS. 6-7, the secondary winding $W_S$ can be a secondary trace $T_S$ on a secondary circuit board 61. The secondary trace $T_S$ can include a spiral shape. The primary winding $W_P$ as a primary trace $T_P$ on a primary circuit board 41 (FIGS. 4-5) can be combined with the secondary winding $W_S$ as a secondary trace $T_S$ on a secondary circuit board 61 (FIGS. 6-7) to form a stage S.

Use of traces $T_P$ and $T_S$ on circuit boards 41 and 61 can improve manufacturability. Such a design is relatively low cost and easily repeatable. Repeatable manufacturing allows resonance at the same frequency among the multiple units manufactured.

A circuit board (41, 61, or both) can provide the needed electrical insulation between the primary trace $T_P$ and the secondary trace $T_S$. The circuit board can also allow the primary trace $T_P$ and the secondary trace $T_S$ to be close, thus providing needed coupling of the windings $W_P$ and $W_S$. An example circuit board (41, 61, or both) can comprise polyimide. Material (e.g. copper) of the traces $T_P$, $T_S$, or both can be deposited on a circuit board. Trace shape can be etched into this material.

Circuit board thicknesses $Th_{41}$ and $Th_{61}$ can be selected based on a balance between needed electrical insulation (thicker is better) between the primary trace $T_P$ and the secondary trace $T_S$ and needed coupling between the primary trace $T_P$ and the secondary trace $T_S$ (thinner is better). Example thicknesses $Th_{4a}$ of the primary circuit board 41 include $Th_{41}$ 0.05 mm, $Th_{41} \geq 0.2$ mm, $Th_{41} \geq 0.5$ mm, or $Th_{41} \geq 0.8$ mm. Other example thicknesses $Th_{41}$ of the primary circuit board 41 include $Th_{41} \leq 0.6$ mm, $Th_{41} \leq 0.8$ mm, $Th_{41} \leq 2$ mm, or $Th_{41} \leq 5$ mm. Example thicknesses $Th_{61}$ of the secondary circuit board 61 include $Th_{61} \geq 0.05$ mm, $Th_{61} \geq 0.2$ mm, $Th_{61} \geq 0.5$ mm, or $Th_6 \geq \geq 0.8$ mm. Other example thicknesses $Th_{61}$ of the secondary circuit board 61 include $Th_{61} \leq 0.6$ mm, $Th_{61} \leq 0.8$ mm, $Th_{61} \leq 2$ mm, or $Th_{61} \leq 5$ mm.

The primary circuit board 41 can be the same as the secondary circuit board 61. Alternatively, another material can be between the primary trace $T_P$ and the secondary trace $T_S$.

A minimum distance between the primary trace $T_P$ and the secondary trace $T_S$ can be $\geq 0.05$ mm, $\geq 0.2$ mm, $\geq 0.5$ mm, or $\geq 0.8$ mm. A maximum distance between the primary trace $T_P$ and the secondary trace $T_S$ can be $\leq 0.6$ mm, $\leq 0.8$ mm, $\leq 2$ mm, or $\leq 5$ mm.

The example traces, circuit boards, and thicknesses of FIGS. 4-7 can be combined with any other high voltage power supply examples described herein, including those shown in any of FIGS. 1-3 and 8-14.

As illustrated in FIGS. 8-11b, the primary winding $W_P$ (shown as a primary trace $T_P$ in these figures) can be located in close proximity to the secondary winding $W_S$ (shown as secondary trace(s) $T_S$ in these figures).

Figure 8:
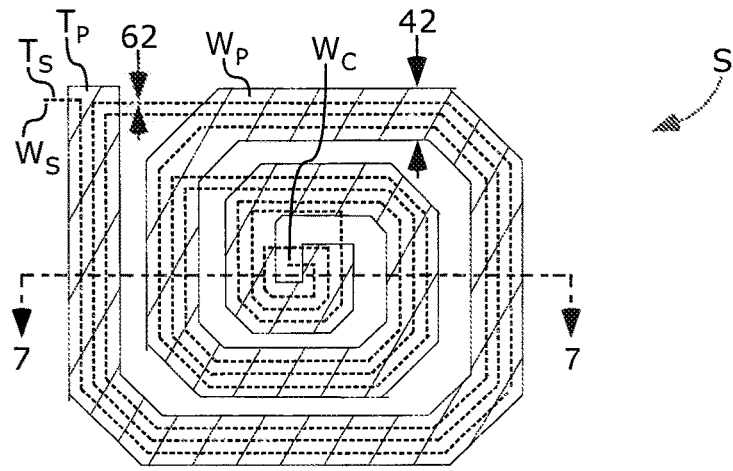
FIG. 8 is a top-view of a portion of a stage S with a primary trace and a secondary trace in close proximity, with much of the secondary trace overlapping the primary trace.

In FIG. 8, the primary trace $T_P$ and the secondary trace $T_S$ are adjacent to each other (close together but not touching), and much of the secondary trace $T_S$ overlaps the primary trace $T_P$, as viewed from perpendicular to the spiral shape. The secondary trace $T_S$ can overlap the primary trace $T_P$ along at least 80% of a length of the secondary trace $T_S$ (the overlap evaluated perpendicular to and passing through the face of the secondary circuit board 61). Such overlapping can result in improved electrical coupling between the primary trace $T_P$ and the secondary trace $T_S$. Alternatively, the primary trace $T_P$ can overlap the secondary trace $T_S$ in a step-down transformer. For clarity, the primary trace $T_P$ and the secondary trace $T_S$ are shown in FIG. 8 without the circuit board(s) 41 and 61.

As illustrated in FIG. 8, the primary trace $T_P$ can have a width 42 that is at least four times greater than a width 62 of the secondary trace $T_S$. The width 42 of the primary trace $T_P$ is measured parallel to a face of the primary circuit board 41. The width 62 of the secondary trace $T_S$ is measured parallel to a face of the secondary circuit board 61. These widths 42 and 62 are measured perpendicular to a length of the trace $T_P$ or $T_S$ at the point of measurement.

The example traces $T_P$ and $T_S$ of FIG. 8 can be combined with any other high voltage power supply examples described herein, including those shown in any of FIGS. 1-7 and 9a-14.

The primary trace $T_P$ and the secondary trace $T_S$ can be on separate circuit boards 41 and 61, as illustrated in FIGS. 9a-9b. In contrast, a single circuit board is used for both the primary circuit board 41 and the secondary circuit board 61 for planar transformer 100 in FIG. 10. A selection between the planar transformers of FIGS. 9a-10 can be made based on manufacturability, cost, and needed coupling of the windings $W_P$ and $W_S$.

The example traces and circuit boards of FIGS. 9a-10 can be combined with any other high voltage power supply examples described herein, including those shown in any of FIGS. 1-8 and 11-14.

As illustrated in FIGS. 11a-11b, the secondary circuit board 61 can include two secondary circuit boards 61a and 61b. The design of FIGS. 11a-11b improves coupling between the primary winding $W_P$ and the secondary winding $W_S$ and allows a compact planar transformer design.

The secondary winding $W_S$ can be divided into two secondary winding parts $W_{sa}$ and $W_{sb}$. The two secondary circuit boards 61a and 61b can be separate and spaced apart from each other. The two secondary circuit boards 61a and 61b can be parallel with respect to each other.

One of the two secondary winding parts $W_{sa}$ can be on one of the two secondary circuit boards 61a. The other of the two secondary winding parts $W_{sb}$ can be on the other of the two secondary circuit boards 61b.

The primary winding $W_P$ can be sandwiched between the two secondary winding parts $W_{sa}$ and $W_{sb}$. The primary winding W can be sandwiched between the two secondary circuit boards 61a and 61b.

The two secondary winding parts $W_{sa}$ and $W_{sb}$ can be located on outer faces of the two secondary circuit boards 61a and 61b. The two secondary circuit boards 61a and 61b can be sandwiched between the two secondary winding parts $W_{sa}$ and $W_{sb}$.

The two secondary winding parts $W_{sa}$ and $W_{sb}$ can be connected at a center of the spiral shape, such connection called a secondary winding connection $W_C$. The secondary winding connection $W_C$ can extend through a center of the primary circuit board 41. The spiral shape of one of the two secondary winding parts $W_{sa}$ or $W_{sb}$ can spiral in and the other can spiral out (spiral direction defined as a direction of current flow at a single point in time). Sandwiching the primary winding $W_P$ between the two secondary winding parts $W_{sa}$ and $W_{sb}$ and forming a spiral direction as noted above can improve electromagnetic coupling.

The two secondary winding parts $W_{sa}$ and $W_{sb}$ located on faces of the two secondary circuit boards 61a and 61b can be combined with the connection of the two secondary winding parts $W_{sa}$ and $W_{sb}$ at a center of the spiral shape. Alternatively, the two secondary winding parts $W_{sa}$ and $W_{sb}$ located on faces of the two secondary circuit boards 61a and 61b can be connected at another location than in the center of the spiral shape.

As illustrated in FIG. 11b, the primary circuit board 41 can be the same circuit board as one of two secondary circuit boards 61a and 61b.

The example windings and circuit boards of FIGS. 11a-11b can be combined with any other high voltage power supply examples described herein, including those shown in any of FIGS. 1-10 and 12-14.

Higher voltage stages S can benefit from larger circuit board thickness. Each additional stage S multiplies or increase bias voltage of the secondary trace $T_S$. But each additional stage S does not multiply or increase bias voltage of the primary trace $T_P$. Therefore, a voltage differential, between the secondary trace $T_S$ and the primary trace $T_P$, increases moving up in the array of planar transformers, from the lowest voltage stage $S_L$ towards the highest voltage stage $S_H$.

Higher voltage stages S can benefit from larger thickness ($Th_{41}$, $Th_{61}$, or both) circuit board(s). This can avoid arcing at higher voltage stages S due to too thin of a circuit board. Lower voltage stages S can benefit from a smaller thickness ($Th_{41}$, $Th_{61}$, or both) circuit board(s). This can improve electrical coupling at lower voltage stages S. Thus, a maximum thickness of the circuit board(s) 41 and 61 can increase with each stage, moving from the lowest voltage stage $S_L$ to the highest voltage stage $S_H$.

Circuit board thickness can thus match a voltage differential across the stage, as illustrated in FIG. 12. High voltage power supply 120 includes different thicknesses $Th_L$, $Th_I$, $Th_H$ of the circuit boards (41, 61, or both) in each stage S with respect to other stages S. Example relationships of circuit board thicknesses between the stages include: $Th_L < Th_I$, $Th_I < Th_H$, $1.1*Th_L < Th_I$, $1.1*Th_I < Th_H$, $1.5*Th_L < Th_I$, $1.5*Th_I < Th_H$, $2*Th_L < Th_I$, $2*Th_I < Th_H$, or combinations thereof. $Th_L$ is a maximum thickness of the primary circuit board 41 and the secondary circuit board 61 of the lowest voltage stage $S_L$. $Th_I$ is a maximum thickness of the primary circuit board 41 and the secondary circuit board 61 of an intermediate stage $S_I$. $Th_H$ is a maximum thickness of the primary circuit board 41 and the secondary circuit board 61 of the highest voltage stage $S_H$.

The example stages and circuit board thicknesses $Th_L$, $Th_I$, and $Th_H$ of FIG. 12 can be combined with any other high voltage power supply examples described herein, including those shown in any of FIGS. 1-11 and 13-14.

As illustrated in FIG. 13, high voltage power supply 130 can include or consist of potting 131 between some or all of the stages S. The potting 131 can adjoin the adjacent stages S. High voltage power supply 130 includes potting 131 between and adjoining the lowest voltage stage $S_L$ and the intermediate stage $S_I$; and potting 131 between and adjoining the intermediate stage $S_I$ and the highest voltage stage $S_H$. The potting 131 can be electrically-resistive and can provide arc protection between the stages S.

The example potting of FIG. 13 can be combined with any other high voltage power supply examples described herein, including those shown in any of FIGS. 1-12 and 14.

A distance $D_S$ between adjacent stages S can be selected based on a balance between arc protection (larger is better) and overall size of the array of planar transformers (smaller is better). This distance $D_S$ is illustrated in FIGS. 12-13, but is applicable to any other high voltage power supply examples described herein, including those shown in any of FIGS. 1-11b and 14.

Example minimum distances $D_S$ between all adjacent stages S of the array of planar transformers include: $D_S \geq 0.05$ mm, $D_S \geq 0.2$ mm, $D_S \geq 0.5$ mm, or $D_S \geq 0.8$ mm. Example maximum distances $D_S$ between all adjacent stages S of the array of planar transformers include: $D_S \leq 0.6$ mm, $D_S \leq 0.8$ mm, $D_S \leq 2$ mm, or $D_S \leq 5$ mm.

If insulating material between adjacent stages S is the same as material of the circuit board 41 or 61 between the primary winding $W_P$ and the secondary winding $W_S$, then the distance $D_S$ can be the same as circuit board 41 thicknesses $Th_{41}$, $Th_{61}$, or both.

Capacitors 141 and 142 in a stage S are illustrated in FIG. 14. The primary circuit $C_P$ can include a primary capacitor 141 electrically-coupled in parallel with the primary winding $W_P$. Capacitance of the primary capacitor 141 can be selected for resonance with magnetizing inductance (i.e. with open circuit inductance of the primary winding $W_P$).

The secondary circuit Cs can include a secondary capacitor 142 electrically-coupled in parallel with the secondary winding $W_S$. The secondary capacitor 142 can be selected to resonate with leakage inductance of the stage S. The primary capacitor 141 and the secondary capacitor 142 can be selected for resonance between the primary circuit $C_P$ and the secondary circuit Cs.

Resonant frequency of the magnetizing inductance/primary capacitance combination and resonant frequency of the leakage inductance/secondary capacitance combination can be the same.

The example capacitors of FIG. 14 can be combined with any other high voltage power supply examples described herein, including those shown in any of FIGS. 1-13.

Following are specifications of an example stage S. Primary winding $W_P$ inductance is 563 nH. Secondary winding $W_S$ inductance is 36.03 pH. Leakage inductance is 493 nH. Capacitance of capacitor $R_C$ of the rectifier circuit R is 10 pF. Capacitance of the primary capacitor 141 is 45 µF. Capacitance of the secondary capacitor 142 is 210 pF. These capacitors $R_C$, 141, and 142, and the diode $R_D$ of the rectifier circuit R, are rated to 8 kV. A primary to secondary turn ratio is 4:40. A resistance of the high voltage device 12 is one megaohm.

The high voltage power supplies described herein can provide rapid pulses of high voltage, at a much higher frequency than a Cockcroft-Walton multiplier. As used herein, pulse(s) of high voltage means a voltage rise of the specified amount (e.g. 10 kV) followed by a drop of that specified amount. For example, high voltage power supplies described herein can provide a pulse of $\geq 10$ kV, repeated within $\leq 20$ microseconds, $\leq 50$ microseconds, or $\leq 100$ microseconds. The high voltage power supplies described herein can provide pulses of $\geq 10$ kV, $\geq 40$ kV, or $\geq 80$ kV with a period of $\leq 20$ microseconds, $\leq 50$ microseconds, or $\leq 100$ microseconds. Example maximum voltage of each pulse include $\leq 100$ kV, $\leq 250$ kV, or $\leq 1000$ kV. These pulses of voltage applied across an x-ray tube can result in pulses of x-rays emitted from the x-ray tube.

Each successive pulse can have a different amplitude compared to other or adjacent pulses. There can be a large amplitude difference between adjacent pulses, such as for example $\geq 50$ V, $\geq 1$ kV, $\geq 10$ kV, or $\geq 40$ kV and $\leq 1$ kV, $\leq 40$ kV, or $\leq 100$ kV. This amplitude difference between adjacent pulses can be between all adjacent pulses or between at least two adjacent pulses. These voltage amplitude differences between pulses can result in emission of different x-ray spectrum with each pulse, which may be used for analysis in x-ray fluorescence analysis of a material exposed by different x-rays.

The high voltage power supplies described herein can be lighter and smaller than other high voltage power supplies (e.g. compared to iron core transformer).

The DC output $O_{dc}$ of the rectifier circuit R of the highest voltage stage $S_H$ can be controlled to a high level of accuracy and precision, even without a voltage sensor and a feedback loop. Therefore, an x-ray source, with one of the high voltage power supplies described herein, can be made free of a voltage sensor (for sensing bias voltage between a cathode and an anode of the x-ray tube).

What is claimed is:

1. An x-ray source comprising:
an x-ray tube and a high voltage power supply;
the high voltage power supply including multiple planar transformers, each defining a stage, electrically coupled in series, including a lowest voltage stage and a highest voltage stage;
each stage comprising: (a) a primary circuit including an alternating current source electrically-coupled to a primary winding and configured to provide alternating electrical current through the primary winding, the primary winding being a primary trace on a primary circuit board, the primary trace including a spiral shape; (b) a secondary circuit including a secondary winding and a rectifier circuit in series, the secondary winding being a secondary trace on a secondary circuit board, the secondary trace including a spiral shape; (c) the primary winding located in close proximity to the secondary winding such that the alternating electrical current through the primary winding will induce an alternating electrical current through the secondary winding; and (d) the rectifier circuit including a DC output configured to provide direct electrical current;
the secondary circuit of each stage, except for the lowest voltage stage, is electrically coupled to the DC output of the rectifier circuit of a lower voltage stage;
the DC output of the rectifier circuit of each stage, except for the highest voltage stage, is electrically coupled to the secondary circuit of a higher voltage stage; and
the DC output of the rectifier circuit of the highest voltage stage is electrically coupled to the x-ray tube;
the multiple planar transformers further comprise an intermediate stage between the lowest voltage stage and the highest voltage stage;
$Th_L < Th_I < Th_H$, where $Th_L$ is a maximum thickness of the primary circuit board and the secondary circuit board of the lowest voltage stage, $Th_I$ is a maximum thickness of the primary circuit board and the secondary circuit board of the intermediate stage, and $Th_H$ is a maximum thickness of the primary circuit board and the secondary circuit board of the highest voltage stage.

2. The x-ray source of claim 1, wherein the primary trace has a width that is at least four times greater than a width of the secondary trace, the width of the primary trace is measured parallel to a face of the primary circuit board, and the width of the secondary trace is measured parallel to a face of the secondary circuit board.

3. The x-ray source of claim 2, wherein the secondary trace overlaps the primary trace along at least 80% of a length of the secondary trace, the overlap evaluated perpendicular to and passing through the face of the secondary circuit board.

4. The x-ray source of claim 1, wherein:
the multiple planar transformers further comprise an intermediate stage between the lowest voltage stage and the highest voltage stage;
potting is between and adjoins the lowest voltage stage and the intermediate stage; and
potting is between and adjoins the intermediate stage and the highest voltage stage.

5. The x-ray source of claim 1, wherein the high voltage power supply is capable of providing pulses of ≥10 kV with a period of ≤50 microseconds, each pulse of voltage causing a pulse of x-rays.

6. The x-ray source of claim 5, wherein successive pulses have a voltage amplitude difference of ≥1 kV and ≤1000 kV with respect to each other.

7. The x-ray source of claim 1, wherein the x-ray source is free of a voltage sensor for sensing bias voltage between a cathode and an anode of the x-ray tube.

8. The x-ray source of claim 1, wherein:
each primary circuit further comprises a primary capacitor electrically-coupled in parallel with the primary winding;
each secondary circuit further comprises a secondary capacitor electrically-coupled in parallel with the secondary winding.

9. The x-ray source of claim 1, wherein for each stage, the primary circuit is resonant with the secondary circuit.

10. The x-ray source of claim 1, wherein $1.5*Th_L < Th_I$ and $1.5*Th_I < Th_H$.

11. The x-ray source of claim 1, wherein:
0.2 mm ≤ $Th_{41}$ ≤ 0.8 mm, where $Th_{41}$ is a thickness of the primary circuit board; and
0.2 mm ≤ $Th_{61}$ ≤ 0.8 mm, where $Th_{61}$ is a thickness of the secondary circuit board.

12. The x-ray source of claim 1, wherein a minimum distance between the primary trace and the secondary trace is ≥0.2 mm and a maximum distance between the primary trace and the secondary trace is ≤2 mm.

13. The x-ray source of claim 1, wherein 0.2 mm ≤ $D_s$ ≤ 2 mm, where $D_s$ is a minimum distance between all adjacent stages of the array of planar transformers.

14. The x-ray source of claim 1, wherein:
the secondary winding is divided into two secondary winding parts, the secondary circuit board includes two secondary circuit boards, the two secondary circuit boards being separate and spaced apart from each other;
one of the two secondary winding parts is on one of the two secondary circuit boards and the other of the two secondary winding parts is on the other of the two secondary circuit boards;
the primary winding is sandwiched between the two secondary winding parts;
the two secondary winding parts are connected at a center of the spiral shape defining a secondary winding connection; and
the secondary winding connection extends through a center of the primary circuit board.

15. The x-ray source of claim 1, wherein:
the secondary winding is divided into two secondary winding parts, the secondary circuit board includes two secondary circuit boards, the two secondary circuit boards being separate and spaced apart from each other;
one of the two secondary winding parts is on one of the two secondary circuit boards and the other of the two secondary winding parts is on the other of the two secondary circuit boards;
the primary winding is sandwiched between the two secondary winding parts; and the spiral shape of one of the two secondary winding parts spirals in and the spiral shape of the other of the two secondary winding parts spirals out, spiral direction being defined as a direction of current flow at a single point in time.

16. An x-ray source comprising:

an x-ray tube and a high voltage power supply;

the high voltage power supply including multiple planar transformers, each defining a stage, electrically coupled in series, including a lowest voltage stage and a highest voltage stage;

each stage comprising: (a) a primary circuit including an alternating current source electrically-coupled to a primary winding and configured to provide alternating electrical current through the primary winding, the primary winding being a primary trace on a primary circuit board, the primary trace including a spiral shape; (b) a secondary circuit including a secondary winding and a rectifier circuit in series, the secondary winding being a secondary trace on a secondary circuit board, the secondary trace including a spiral shape; (c) the primary winding located in close proximity to the secondary winding such that the alternating electrical current through the primary winding will induce an alternating electrical current through the secondary winding; and (d) the rectifier circuit including a DC output configured to provide direct electrical current;

the secondary circuit of each stage, except for the lowest voltage stage, is electrically coupled to the DC output of the rectifier circuit of a lower voltage stage;

the DC output of the rectifier circuit of each stage, except for the highest voltage stage, is electrically coupled to the secondary circuit of a higher voltage stage;

the DC output of the rectifier circuit of the highest voltage stage is electrically coupled to the x-ray tube;

the secondary winding is divided into two secondary winding parts, the secondary circuit board includes two secondary circuit boards, the two secondary circuit boards being separate and spaced apart from each other;

one of the two secondary winding parts is on one of the two secondary circuit boards and the other of the two secondary winding parts is on the other of the two secondary circuit boards; and the primary winding is sandwiched between the two secondary winding parts;

the two secondary winding parts are connected at a center of the spiral shape defining a secondary winding connection; and the secondary winding connection extends through a center of the primary circuit board.

17. The x-ray source of claim 16, wherein the spiral shape of one of the two secondary winding parts spirals in and the spiral shape of the other of the two secondary winding parts spirals out, spiral direction being defined as a direction of current flow at a single point in time.

18. The x-ray source of claim 16, wherein:

the primary trace has a width that is at least four times greater than a width of the secondary trace, the width of the primary trace is measured parallel to a face of the primary circuit board, and the width of the secondary trace is measured parallel to a face of the secondary circuit board; and the secondary trace overlaps the primary trace along at least 80% of a length of the secondary trace, the overlap evaluated perpendicular to and passing through the face of the secondary circuit board.

19. An x-ray source comprising:

an x-ray tube and a high voltage power supply;

the high voltage power supply including multiple planar transformers, each defining a stage, electrically coupled in series, including a lowest voltage stage and a highest voltage stage;

each stage comprising: (a) a primary circuit including an alternating current source electrically-coupled to a primary winding and configured to provide alternating electrical current through the primary winding, the primary winding being a primary trace on a primary circuit board, the primary trace including a spiral shape; (b) a secondary circuit including a secondary winding and a rectifier circuit in series, the secondary winding being a secondary trace on a secondary circuit board, the secondary trace including a spiral shape; (c) the primary winding located in close proximity to the secondary winding such that the alternating electrical current through the primary winding will induce an alternating electrical current through the secondary winding; and (d) the rectifier circuit including a DC output configured to provide direct electrical current;

the secondary circuit of each stage, except for the lowest voltage stage, is electrically coupled to the DC output of the rectifier circuit of a lower voltage stage;

the DC output of the rectifier circuit of each stage, except for the highest voltage stage, is electrically coupled to the secondary circuit of a higher voltage stage; and the DC output of the rectifier circuit of the highest voltage stage is electrically coupled to the x-ray tube;

the secondary winding is divided into two secondary winding parts, the secondary circuit board includes two secondary circuit boards, the two secondary circuit boards being separate and spaced apart from each other;

one of the two secondary winding parts is on one of the two secondary circuit boards and the other of the two secondary winding parts is on the other of the two secondary circuit boards; and the primary winding is sandwiched between the two secondary winding parts; and the spiral shape of one of the two secondary winding parts spirals in and the spiral shape of the other of the two secondary winding parts spirals out, spiral direction being defined as a direction of current flow at a single point in time.

20. The x-ray source of claim 19, wherein:

the primary trace has a width that is at least four times greater than a width of the secondary trace, the width of the primary trace is measured parallel to a face of the primary circuit board, and the width of the secondary trace is measured parallel to a face of the secondary circuit board; and the secondary trace overlaps the primary trace along at least 80% of a length of the secondary trace, the overlap evaluated perpendicular to and passing through the face of the secondary circuit board.

\* \* \* \* \*